(12) United States Patent
Webb

(10) Patent No.: US 8,344,789 B2
(45) Date of Patent: Jan. 1, 2013

(54) ANALOG SWITCH WITH INTERNAL DEVICE BODY CONTROL

(75) Inventor: Robert W. Webb, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 274 days.

(21) Appl. No.: 12/839,114

(22) Filed: Jul. 19, 2010

(65) Prior Publication Data

US 2011/0175669 A1    Jul. 21, 2011

Related U.S. Application Data

(60) Provisional application No. 61/296,752, filed on Jan. 20, 2010.

(51) Int. Cl.
*H03K 3/01* (2006.01)
(52) U.S. Cl. .......................... 327/534; 327/404
(58) Field of Classification Search ................... 327/404, 327/534
See application file for complete search history.

(56) References Cited

U.S. PATENT DOCUMENTS

| | | | | |
|---|---|---|---|---|
| 5,767,733 A * | 6/1998 | Grugett | ......................... | 327/534 |
| 6,828,846 B2 * | 12/2004 | Tsukazaki et al. | ............ | 327/404 |
| 7,720,546 B2 * | 5/2010 | Ginggen et al. | ................ | 607/61 |
| 7,724,069 B1 * | 5/2010 | Webb | ............................ | 327/534 |
| 7,728,649 B1 * | 6/2010 | Webb et al. | .................... | 327/534 |

OTHER PUBLICATIONS

"+1.8V to +6.5V, Sub-Ohm, Dual SPDT Analog Switch with Negative Signal Capability." Intersil Data Sheet, Mar. 5, 2009 FN6579.1. ISL54059. pp. 1-14.

* cited by examiner

*Primary Examiner* — Hai L Nguyen
(74) *Attorney, Agent, or Firm* — Gary Stanford

(57) ABSTRACT

A body control apparatus for an analog switch for minimizing leakage current and keeping PN junctions reverse-biased. The analog switch has first and second switch device clusters coupled between input and output nodes and controlled by a control input, each having a corresponding body junction. The body control apparatus includes body control devices each controlled by one of the input and output nodes for coupling a body junction to the opposite one of the input and output nodes. Each switch device cluster may include a main switch and body devices which keep the body junction of the main switch at a voltage level between the input and output nodes when the analog switch is on. When the analog switch is off, the body control apparatus activates when voltage across the input and output nodes rises to keep the body junctions at desired voltage levels.

14 Claims, 4 Drawing Sheets

ANALOG SWITCH WITH INTERNAL DEVICE BODY CONTROL

CROSS-REFERENCE TO RELATED APPLICATIONS

This application claims the benefit of U.S. Provisional Application Ser. No. 61/296,752, filed on Jan. 20, 2010, which is hereby incorporated by reference in its entirety for all intents and purposes.

BRIEF DESCRIPTION OF THE DRAWINGS

The benefits, features, and advantages of the present invention will become better understood with regard to the following description, and accompanying drawings where.

DETAILED DESCRIPTION

Figure 1:
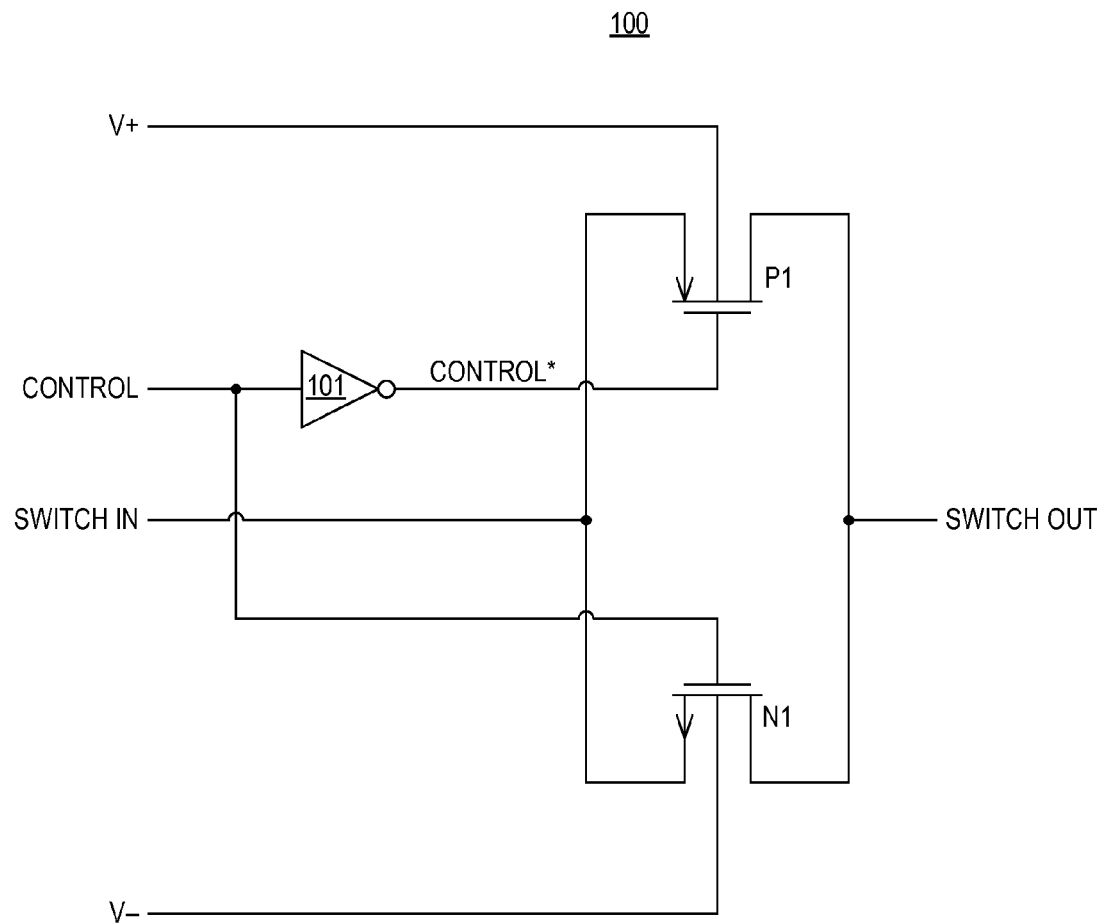
FIG. 1 is a schematic diagram of a conventional analog switch illustrating a common solution in which the body junctions of the devices are hardwired to the power rails.

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Analog switches include some arrangement of N-type and P-type transistor devices, such as P-channel and N-channel metal-oxide semiconductor (MOS) devices coupled in parallel, in order to provide a relatively consistent ON resistance over a range of signal voltages that extend between the power rails, shown herein as V+ and V−. As understood by those of ordinary skill in the art, N-type devices, such as N-channel MOS (NMOS) transistor devices (also known as metal-oxide semiconductor, field-effect transistors or MOSFETs), are of a first conductivity type and P-type devices, such as P-channel MOS (PMOS) transistor devices, are of a second conductivity type. V+ generally references an upper voltage level, such as 5 Volts (V), 4.5V, 3V, 2.5V, 1.8V, etc., and V− generally references a lower voltage level, such as ground (GND), although any other suitable voltage ranges and levels are possible and contemplated. The MOS devices have body junctions that should be properly controlled in order to prevent inadvertent forward biasing of the body to drain P-N junction or the body to source P-N junction of each device. This is particularly important when the switch is turned off and the switch terminals may be at any voltage level near or within the power rails and independent of one another.

A conventional symbol for MOS transistor devices has an arrow symbol depicting the source terminal relative to the drain terminal, in which the drain is shown as a line without the arrow symbol. The PMOS or P-type transistor device has the arrow pointing into the body symbol (parallel lines) whereas the NMOS or N-type transistor device has the arrow pointing out of the body symbol. Both device symbols have another line on the opposite side of the body symbol representing the control or gate terminal. The present invention is not limited to particular types or configurations of P-type and N-type devices which may have asymmetrical or symmetrical geometries. In the embodiments described herein and shown in the drawings, the PMOS and NMOS transistor devices depicted are symmetrically constructed so that distinction between the drain and source is arbitrary. Electronically speaking, the source of a P-channel is whichever terminal has a more positive voltage level, and the source of an N-channel is whichever terminal has a more negative voltage. In an analog switch in which the voltage at the input may be higher or lower than that of the output terminal depending upon operation at any given time, the location of the source relative to the drain is arbitrary in the drawings. The convention of the arrow symbol is used within in the drawings for purposes of distinguishing P-type devices (arrow pointing inwards) versus N-type devices (arrow pointing outwards) rather than distinguishing between the drain and source terminals. The drain and source terminals of each device are more generally referred to as current terminals with reference to the drawings. The current between the current terminals is controlled by the voltages applied to the device, particularly to the gate or control terminal of the device. The terms "drain" and "source" are still referenced with respect to biasing relative to the body junctions during operation.

FIG. 1 is a schematic diagram of a conventional analog switch 100 illustrating a common solution in which the body junctions of the devices are hardwired to the power rails V+ or V−. As shown a main P-channel switch device P1 has a body junction coupled to the upper voltage rail V+ and a main N-channel switch device N1 has a body junction coupled to the lower voltage rail V−. A CONTROL input turns on and off the analog switch 100. CONTROL is provided to an input of an inverter 101, having an output providing an inverted control voltage CONTROL* (in which an asterisk "*" denotes logical negation of a signal). CONTROL is provided to the gate of N1 and CONTROL* is provided to the gate of P1. One current terminal of each of the P1 and N1 devices are coupled together at an input node receiving an input voltage signal SWITCH IN and the other current terminals of P1 and N1 are coupled together at an output node providing an output voltage signal SWITCH OUT. The voltage range between V− and V+ generally determines the voltage switching range and logic voltage thresholds for the voltage signals CONTROL, CONTROL*, SWITCH IN and SWITCH OUT. For example, in one embodiment for V+ of about 3V and V− at GND, a high logic level may be determined at a voltage level at or above 1.4V and a low logic level may be determined at a voltage level at or below 0.5V, although other voltage ranges and levels are contemplated. In certain configurations, the input and output voltage signals SWITCH IN and SWITCH OUT may rise above V+ or fall below V− by allowable amounts.

In operation, when CONTROL is high, N1 and P1 are both turned on turning on the analog switch 100, and when CONTROL is low, N1 and P1 are both turned off turning off the analog switch 100. When on, the voltage of SWITCH IN is conveyed to the output SWITCH OUT through N1 and P1. This configuration ensures that the drain and source (current terminals) to body junctions remain reverse-biased. The arrangement of the analog switch 100 tends to maximize unwanted leakage current, however, since both body to source and body to drain junctions may be reverse-biased depending upon the potentials of the input and output switch terminals. In addition, the body effects of P1 and N1 increase the threshold of the devices resulting in an increased resistance between the current terminals when the switch 100 is turned on.

Figure 2:
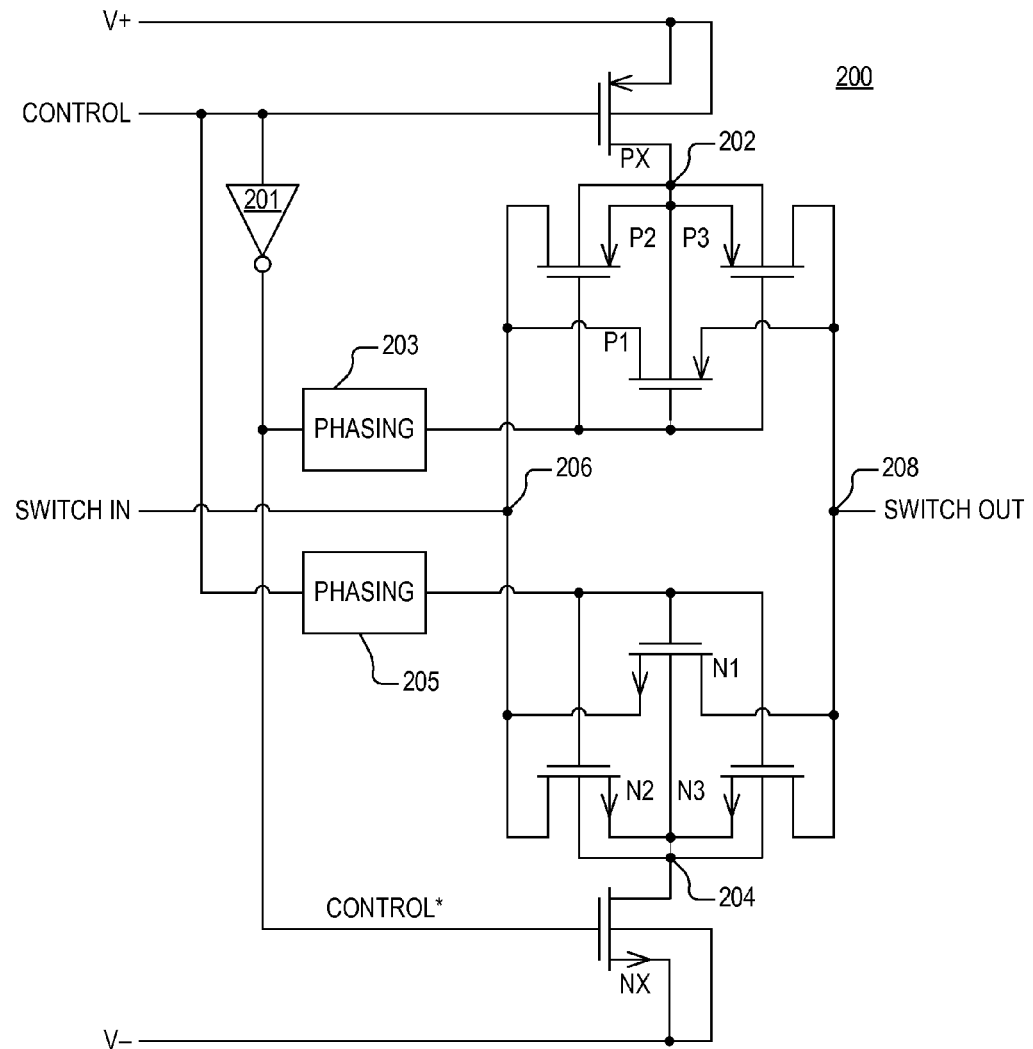
FIG. 2 is a schematic diagram of an alternative conventional analog switch which resolves some of the problems of the analog switch of FIG. 1 but which results in a more complicated and costlier configuration.

FIG. 2 is a schematic diagram of an alternative conventional analog switch 200 which resolves some of the problems of the analog switch 100, but which requires phasing or timing circuitry to ensure proper operation. The analog switch 200 includes the main switching devices N1 and P1 in a similar manner as the analog switch 100. The analog switch further includes P-channel body control transistors P2, P3 and PX and N-channel body control transistors N2, N3 and NX. An inverter 201 receives CONTROL at its input and provides CONTROL* at its output in the same manner as previously described for the analog switch 100. CONTROL is provided to the gate of PX and CONTROL* is provided to the gate of NX. The upper voltage rail V+ is coupled to the body junction and one current terminal of PX and the lower voltage rail V− is coupled to the body junction and one current terminal of NX. The body junctions of P1-P3 are coupled together at a first common node 202, which is further coupled to the other current terminal of PX and to one current terminal of each of P2 and P3. The body junctions of N1-N3 are coupled together at another common node 204, which is further coupled to the other current terminal of NX and to one current terminal of each of N2 and N3. SWITCH IN is provided to an input node 206 which is coupled to the other current terminals of P2 and N2 and to one current terminal of each of N1 and P1. The other current terminals of P1, N1, N3 and P3 are coupled together at an output node 208 which develops the output voltage signal SWITCH OUT. A first phasing circuit 203 has an input receiving CONTROL* and an output coupled to the gates of P1-P3. A second phasing circuit 205 has an input receiving CONTROL and an output coupled to the gates of N1-N3.

The analog switch 200 is turned on by asserting CONTROL high, which turns on the main switch devices P1 and N1 along with body control devices P2, P3, N2 and N3, and which turns off body control devices NX and PX. The analog switch 200 is turned off by asserting CONTROL low, so that NX and PX are turned on and the switch devices P1-P3 and N1-N3 are all turned off. When the switch 200 is turned off, the body junctions of switch devices P1-P3 are switched to the upper voltage rail V+ by PX and the body terminals of N1-N3 are switched to the lower voltage rail V− by NX. P2 and P3 have the same or similar geometry and N2 and N3 have the same or similar geometry, so that when the switch 200 is turned on, the body junctions of the N-channel cluster N1-N3 and that of the P-channel cluster P1-P3 is at a potential approximately midway between the potentials of the two switch terminals SWITCH IN and SWITCH OUT. Devices having the same or similar geometry may be said to be matched devices. Since the voltage across the switch 200, when turned on, seldom exceeds several hundred millivolts (mV), the arrangement of the switch 200 effectively eliminates the body effects as compared to that of the analog switch 100, thereby reducing the switch resistance and the variation of switch resistance with signal level.

The control signals for turning the switch devices on and off for the analog switch 200, however, should be carefully phased with respect to those which control the body control devices NX and PX. As shown, the first phasing circuit 203 controls relative timing between CONTROL as applied to the gate of PX and the output of circuit 203 controlling activations of P1-P3. Likewise, the second phasing circuit 205 controls relative timing between CONTROL* as applied to the gate of NX and the output of circuit 205 controlling that activations of N1-N3. The phasing circuits 203 and 205 generally modify operation during switching, so that after switching, CONTROL is provided to the gates of N1-N3 and CONTROL* is provided to the gates of P1-P3. The phasing circuits 203 and 205 tend to complicate the implementation of the analog switch 200.

Figure 3:
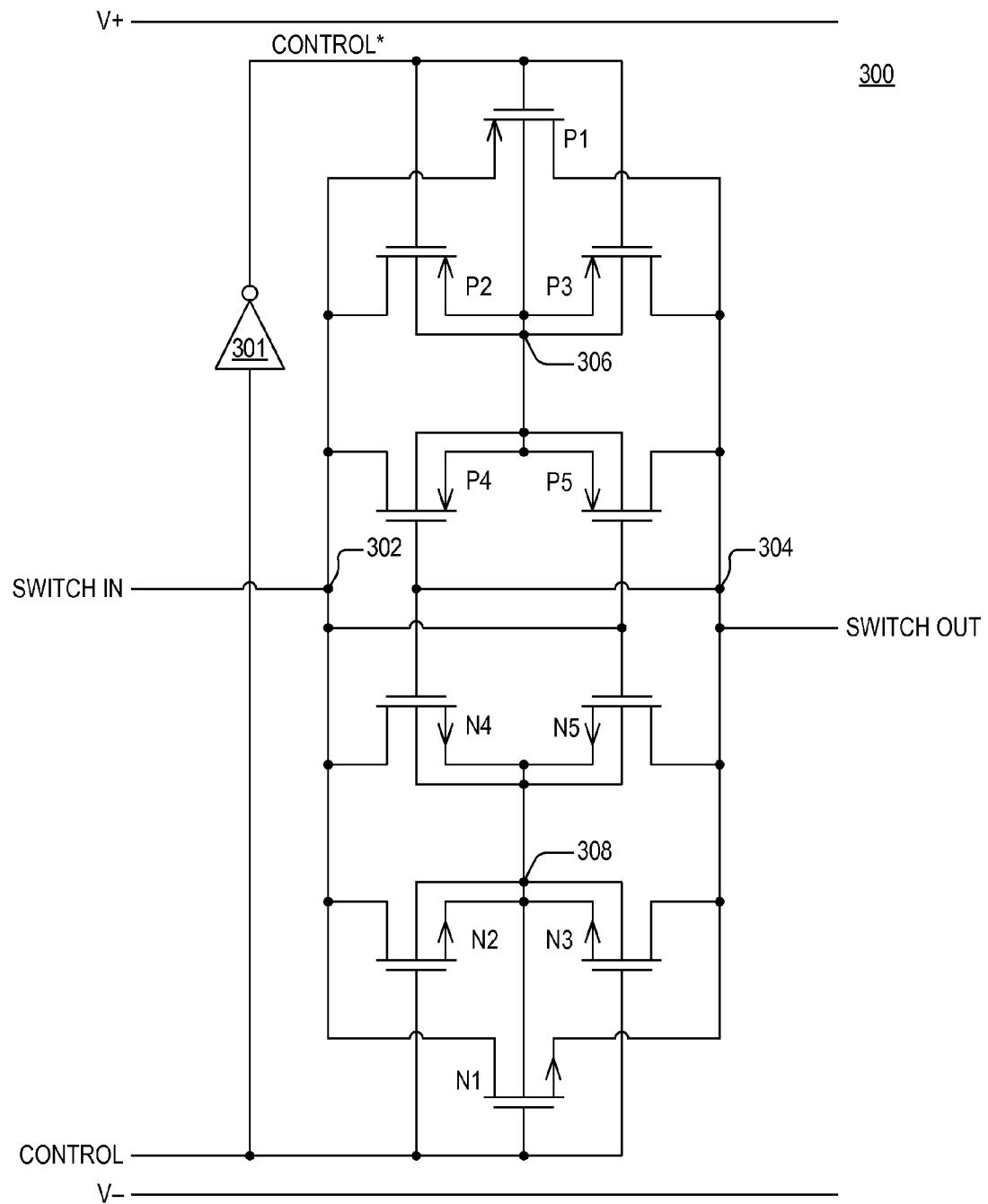
FIG. 3 is a schematic diagram of an analog switch implemented according to one embodiment in which body junction voltages are at least partially determined by input and output voltages.

FIG. 3 is a schematic diagram of an analog switch 300 implemented according to one embodiment. The main switching devices P1 and N1 and body control devices P2, P3, N2 and N3 are included and are coupled in similar manner. The body control devices NX and PX coupled to the power rails V+ and V− are eliminated, and the phasing circuits 203 and 205 are unnecessary and are also eliminated. Additional body devices P4, P5, N4, and N5 are added. A first current terminal of each of the devices P1, P2, P4, N1, N2 and N4 are coupled together at an input node 302 receiving SWITCH IN. The other current terminals of P1 and N1, along with one current terminal of each of the devices P3, P5, N3 and N5 are all coupled together at an output node 304 providing SWITCH OUT. The body junction of P1 is coupled to a first body node 306, which is further coupled to the body junctions of P2-P5 and to the other current terminals of P2-P5. The body junction of N1 is coupled to a second body node 308, which is further coupled to the body junctions of N2-N5 and to the other current terminals of N2-N5. The CONTROL signal is provided to the gates of N1-N3 and to the input of an inverter 301, having an output providing the inverted control signal CONTROL*. CONTROL* is provided to the gates of P1-P3. The input node 302 carrying SWITCH IN is further coupled to the gates of N5 and P5 and the output node 304 carrying SWITCH OUT is further coupled to the gates of N4 and P4. The voltage supply rails V+ and V− are not shown coupled to any of the devices, but are understood to be coupled to source voltage inputs of the inverter 301. Also, V+ and V− generally determine the switching voltage range and levels of the signals SWITCH IN, SWITCH OUT, CONTROL and CONTROL*.

When the analog switch 300 is turned on (when CONTROL is high), the body voltages are controlled in a similar manner as for the analog switch 200. When the analog switch 300 is turned on, the voltage difference between SWITCH IN and SWITCH OUT seldom exceeds several hundred mV which is less than the threshold voltage of the switch devices P4 and P5 or N4 and N5 in the typical process, so that N4, P4, N5 and P5 remain off.

When the analog switch 300 is turned off (when CONTROL is low), however, the body junctions are no longer switched to the power rails V+ and V−. When the analog switch 300 is turned off, the voltage difference between SWITCH IN and SWITCH OUT may be large enough to turn on any of the devices N4, N5, P4 or P5. For example, when the voltage of SWITCH IN is more positive than SWITCH OUT by a sufficient amount, P4 and N5 are turned on while P5 and N4 are turned off. In this case, P4 switches the body junctions of the P-channel devices P1-P5 to the higher voltage of SWITCH IN to ensure that the P-N junctions of these devices do not become forward biased. This further limits the leakage of main switch device P1 to that of the drain-body junction (whereas the OFF leakage of the main switch devices of the switches 100 and 200 can be that of both junctions). Similarly, N5 switches the body junctions of the N-channel devices N1-N5 to the lower voltage of SWITCH OUT to ensure that the P-N junctions of these devices do not become forward biased. This further limits the leakage of main switch device N1 in a similar manner.

Similar advantages are provided when the voltage of SWITCH OUT is more positive than SWITCH IN by a sufficient amount, in which case P4 and N5 are turned off while P5 and N4 are turned on. In this case, P5 is turned on and switches the body junctions of the P-channel devices P1-P5 to the higher voltage of SWITCH OUT to ensure that the P-N junctions of these devices do not become forward biased, and N4 is turned on and switches the body junctions of the N-channel devices N1-N5 to the lower voltage of SWITCH IN to ensure that the P-N junctions of these devices do not become forward biased. The leakage of main switching devices N1 and P1 are reduced as compared to switches 100 and 200 as described above.

In general, the body control devices N4, N5, P4 and P5 are cross-coupled to the input and output nodes so that when the analog switch 300 is turned off, the body junctions of the P-type cluster (devices P1-P3) along with the body junctions of the additional body control devices P4 and P5 are pulled to the higher voltage levels, whereas the body junctions of the N-type cluster (devices N1-N3) along with the body junctions of the additional body control devices N4 and N5 are pulled to the lower voltage levels to ensure that the P-N junctions of these devices are not forward biased. This configuration ensures proper operation and minimizes undesired leakage current. The analog switch 300 eliminates any need for carefully phased control signals for controlling the switch and the body control circuitry as shown for the configuration of the analog switch 200. In addition, the analog switch 300 eliminates connection to the power rails further reducing leakage as compared to the analog switches 100 and 200.

Figure 4:
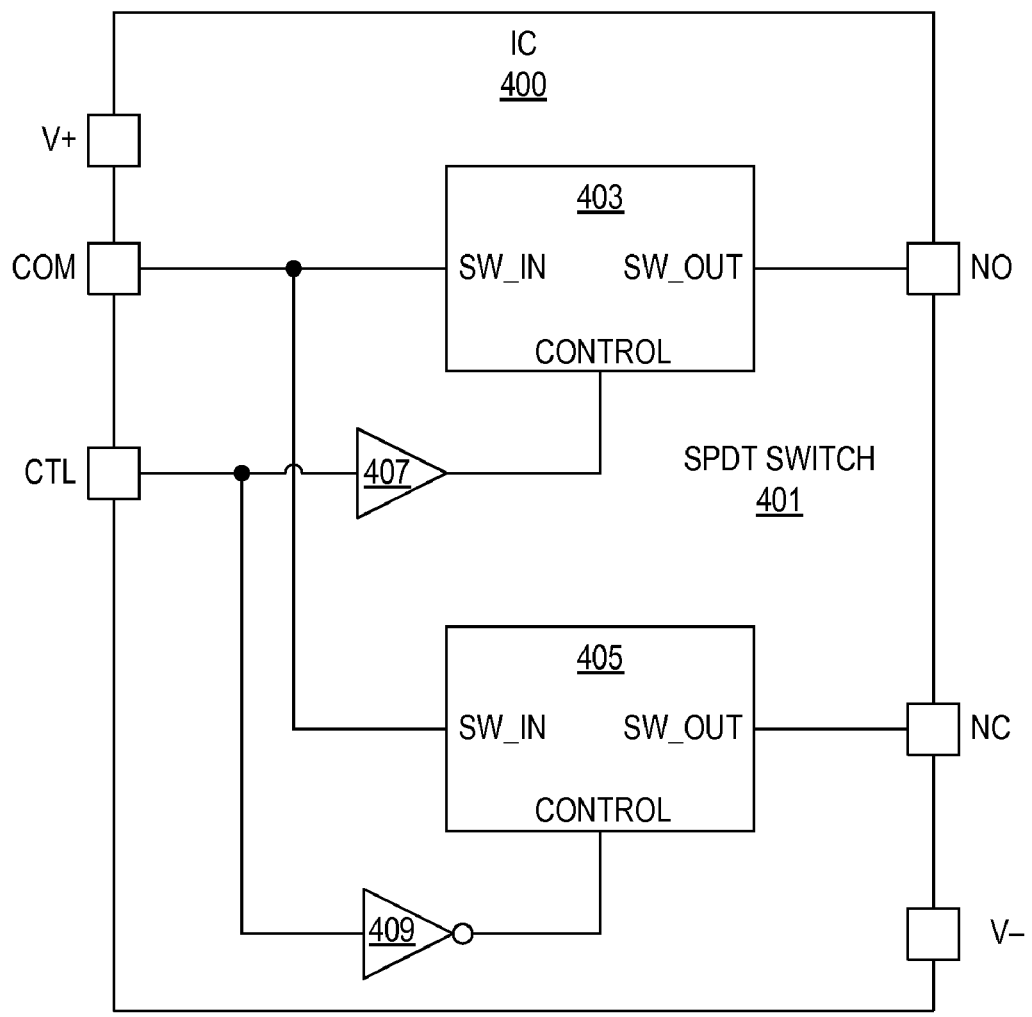
FIG. 4 is a schematic and block diagram of an integrated circuit incorporating a single-pole, double-throw (SPDT) switch using an analog switch implemented according to one embodiment of FIG. 3 and corresponding SPDT symbol.
Figure 4:
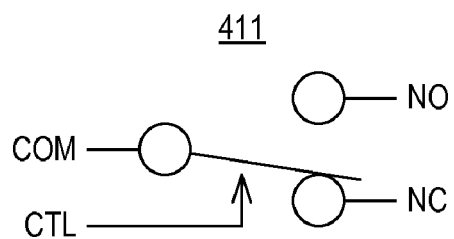

FIG. 4 is a schematic and block diagram of an integrated circuit (IC) 400 (e.g., semiconductor chip device) incorporating a single-pole, double-throw (SPDT) switch 401 using an analog switch implemented according to one embodiment. Also shown in FIG. 4 is a corresponding SPDT symbol 411 for representing the SPDT switch 401 on a schematic diagram. The IC 400 includes multiple pins including source voltage pins receiving the upper and lower voltages V+ and V−. For example, V+ may be a positive source voltage and V− is GND, although other source voltage ranges and levels are contemplated. The IC 400 incorporates first and second analog switches 403 and 405, each configured in substantially the same manner as the analog switch 300. Each switch includes a switch input SW_IN (corresponding to SWITCH IN of analog switch 300), a control input CONTROL (corresponding to the CONTROL input of analog switch 300), and a switch output SW_OUT (corresponding to SWITCH OUT of analog switch 300). The IC 400 includes an input pin receiving a common input signal COM, which is provided to the SW_IN input of each of the analog switches 403 and 405. The IC 400 includes another input pin receiving a control input signal CTL, which is provided to the input of a non-inverting buffer 407 and to the input of an inverter 409. The output of the buffer 407 is provided to the CONTROL input of the analog switch 403 and the output of the inverter 409 is provided to the CONTROL input of the analog switch 405. The SW_OUT output of the analog switch 403 is provided to a first output pin providing a normally open output NO, and the SW_OUT output of the analog switch 405 is provided to a second output pin providing a normally closed output NC.

The control signal CTL toggles activation of the analog switches 403 and 405, where the inverter 409 causes one of the analog switches to be turned on while the other is turned off and vice-versa. The non-inverting buffer 407 inserts a similar delay commensurate with the delay of the inverter 409. As depicted by the SPDT symbol 411, when CTL is low, COM is coupled to the NC output and when CTL is high, COM is switched and coupled to the NO output. The analog switch 403 independently implements a normally-open single-pole, single-throw (SPST) switch and the analog switch 405 independently implements a normally-closed SPST switch. The buffer 407 and the inverter 409 are provided to collectively operate the two analog switches 403 and 405 as a combined SPDT switch. Many other switch configurations are known and contemplated as understood by those of ordinary skill in the art.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention as defined by the following claim(s).

The invention claimed is:

1. An analog switch, comprising:
    a first switch device cluster having current terminals coupled between input and output nodes, having a first control terminal controlled by a control input, and having a first body junction, wherein said first switch device cluster comprises:
        a first device of a first conductivity type having a first current terminal coupled to said input node, having a second current terminal coupled to said output node, having a control terminal receiving an inverted control signal, and having said first body junction;
        a second device of said first conductivity type having a first current terminal coupled to said input node, having a second current terminal coupled to said first body junction, having a control terminal receiving said inverted control signal, and having a body coupled to said first body junction; and
        a third device of said first conductivity type having a first current terminal coupled to said output node, having a second current terminal coupled to said first body junction, having a control terminal receiving said inverted control signal, and having a body coupled to said first body junction;
    a second switch device cluster having current terminals coupled between said input and output nodes, having a second control terminal controlled by said control input, and having a second body junction, wherein said first switch device cluster comprises:
        a first device of a second conductivity type having a first current terminal coupled to said input node, having a second current terminal coupled to said output node, having a control terminal receiving a non-inverted control signal, and having said second body junction;
        a second device of said second conductivity type having a first current terminal coupled to said input node, having a second current terminal coupled to said second body junction, having a control terminal receiving said non-inverted control signal, and having a body coupled to said second body junction; and
        a third device of said second conductivity type having a first current terminal coupled to said output node, having a second current terminal coupled to said second body junction, having a control terminal receiving said non-inverted control signal, and having a body coupled to said second body junction;

a plurality of first body control devices, each having a first current terminal coupled to one of said input and output nodes, each having a control terminal coupled to the other one of said input and output nodes, and each having a second current terminal coupled to said first body junction of said first switch device cluster; and a plurality of second body control devices, each having a first current terminal coupled to one of said input and output nodes, each having a control terminal coupled to the other one of said input and output nodes, and each having a second current terminal coupled to said second body junction of said second switch device cluster.

2. The analog switch of claim 1, wherein said first switch device cluster and said plurality of first body control devices each comprise a plurality of devices of a first conductivity type and wherein said second switch device cluster and said plurality of second body control devices each comprise a plurality of devices of a second conductivity type.

3. The analog switch of claim 1, wherein said first switch device cluster and said plurality of first body control devices each comprise a plurality of P-type transistor devices and wherein said second switch device cluster and said plurality of second body control devices each comprise a plurality of N-type transistor devices.

4. The analog switch of claim 1, wherein said first switch device cluster and said plurality of first body control devices each comprise a plurality of PMOS transistors and wherein said second switch device cluster and said plurality of second body control devices each comprise a plurality of NMOS transistors.

5. The analog switch of claim 1, wherein:
said plurality of first body control devices comprises:
a fourth device of said first conductivity type having a first current terminal coupled to said input node, having a second current terminal coupled to said first body junction, and having a control terminal coupled to said output node; and
a fifth device of said first conductivity type having a first current terminal coupled to said output node, having a second current terminal coupled to said first body junction, and having a control terminal coupled to said input node; and
wherein said plurality of second body control devices comprises:
a fourth device of said second conductivity type having a first current terminal coupled to said input node, having a second current terminal coupled to said second body junction, and having a control terminal coupled to said output node; and
a fifth device of said second conductivity type having a first current terminal coupled to said output node, having a second current terminal coupled to said second body junction, and having a control terminal coupled to said input node.

6. The analog switch of claim 5, wherein said first conductivity type comprises P-type and wherein said second conductivity type comprises N-type.

7. The analog switch of claim 5, wherein said fourth and fifth devices of said first conductivity type each have a body junction coupled to said first body junction and wherein said fourth and fifth devices of said second conductivity type each have a body junction coupled to said second body junction.

8. The analog switch of claim 1, wherein said second and third devices of said first conductivity type are matched with each other and wherein said second and third devices of said second conductivity type are matched with each other.

9. An integrated circuit, comprising:
a plurality of pins; and
at least one integrated analog switch, each comprising:
a first switch device cluster having current terminals coupled between input and output nodes, having a first control terminal controlled by a control signal, and having a first body junction, wherein said first switch device cluster comprises:
a first device of a first conductivity type having a first current terminal coupled to said input node h, aving a second current terminal coupled to said output node, having a control terminal receiving an inverted control signal, and having said first body junction;
a second device of said first conductivity type having a first current terminal coupled to said input node h, aving a second current terminal coupled to said first body junction, having a control terminal receiving said inverted control signal, and having a body coupled to said first body junction; and
a third device of said first conductivity type having a first current terminal coupled to said output node, having a second current terminal coupled to said first body junction, having a control terminal receiving said inverted control signal, and having a body coupled to said first body junction;
a second switch device cluster having current terminals coupled between said input and output nodes, having a second control terminal controlled by said control signal, and having a second body junction, wherein said first switch device cluster comprises:
a first device of a second conductivity type having a first current terminal coupled to said input node, having a second current terminal coupled to said output node, having a control terminal receiving said control signal, and having said second body junction;
a second device of said second conductivity type having a first current terminal coupled to said input node, having a second current terminal coupled to said second body junction, having a control terminal receiving said control signal, and having a body coupled to said second body junction; and
a third device of said second conductivity type having a first current terminal coupled to said output node, having a second current terminal coupled to said second body junction, having a control terminal receiving said control signal, and having a body coupled to said second body junction;
a plurality of first body control devices, each having a first current terminal coupled to one of said input and output nodes, each having a control terminal coupled to the other one of said input and output nodes, and each having a second current terminal coupled to said first body junction of said first switch device cluster; and
a plurality of second body control devices, each having a first current terminal coupled to one of said input and output nodes, each having a control terminal coupled to the other one of said input and output nodes, and each having a second current terminal coupled to said second body junction of said second switch device cluster; and
wherein said input and output nodes are interfaced with first and second pins of said plurality of pins.

10. The integrated circuit of claim 9, wherein said at least one integrated analog switch comprises a first analog switch configured as a normally-open single-pole, single-throw switch and a second analog switch configured as a normally-closed single-pole, single-throw switch.

11. The integrated circuit of claim 10, wherein said plurality of pins includes a control pin receiving said control signal, wherein said control input of said first analog switch receives said control signal, and wherein said control input of said second analog switch receives an inverted version of said control signal.

12. The integrated circuit of claim 9, wherein said first switch device cluster and said plurality of first body control devices each comprise a plurality of devices of a first conductivity type and wherein said second switch device cluster and said plurality of second body control devices each comprise a plurality of devices of a second conductivity type.

13. A method of providing internal device body control of an analog switch, comprising:
turning on a first analog switch device of a first conductivity type and turning on a second analog switch device of a second conductivity type to couple input and output nodes together, and turning off the first and second analog switch devices to isolate the input and output nodes from each other;
when the first and second analog switch devices are turned on, coupling a body junction of the first analog switch device between the input and output nodes and coupling a body junction of the second analog switch device between the input and output nodes;
when the first and second analog switch devices are turned off, coupling the body junction of the first analog switch device to the input node and coupling the body junction of the second analog switch device to the output node when a voltage level of the input node exceeds a voltage level of the output node by a predetermined threshold; and
when the first and second analog switch devices are turned off, coupling the body junction of the first analog switch device to the output node and coupling the body junction of the second analog switch device to the input node when a voltage level of the output node exceeds a voltage level of the input node by the predetermined threshold.

14. The method of claim 13, wherein:
said coupling the body junction of the first analog switch device to the input node comprises activating a first device of the first conductivity type coupled between the body junction of the first analog switch device and the input node;
wherein said coupling the body junction of the second analog switch device to the output node comprises activating a first device of the second conductivity type coupled between the body junction of the second analog switch device and the output node;
wherein said coupling the body junction of the first analog switch device to the output node comprises activating a second device of the first conductivity type coupled between the body junction of the first analog switch device and the output node; and
wherein said coupling the body junction of the second analog switch device to the input node comprises activating a second device of the second conductivity type coupled between the body junction of the second analog switch device and the input node.

* * * * *